(12) United States Patent
Hao

(10) Patent No.: US 10,204,939 B2
(45) Date of Patent: Feb. 12, 2019

(54) DISPLAY SUBSTRATE, MANUFACTURING METHOD THEREOF AND DISPLAY DEVICE

(71) Applicants: BOE TECHNOLOGY GROUP CO., LTD., Beijing (CN); BEIJING BOE OPTOELECTRONICS TECHNOLOGY CO., LTD., Beijing (CN)

(72) Inventor: Jingang Hao, Beijing (CN)

(73) Assignees: BOE TECHNOLOGY GROUP CO., LTD., Beijing (CN); BEIJING BOE OPTOELECTRONICS TECHNOLOGY CO., LTD., Beijing (CN)

( * ) Notice: Subject to any disclaimer, the term of this patent is extended or adjusted under 35 U.S.C. 154(b) by 0 days.

(21) Appl. No.: 15/569,787

(22) PCT Filed: Mar. 6, 2017

(86) PCT No.: PCT/CN2017/075762
§ 371 (c)(1),
(2) Date: Oct. 27, 2017

(87) PCT Pub. No.: WO2017/219702
PCT Pub. Date: Dec. 28, 2017

(65) Prior Publication Data
US 2018/0226437 A1     Aug. 9, 2018

(30) Foreign Application Priority Data

Jun. 22, 2016  (CN) .......................... 2016 1 0460915

(51) Int. Cl.
*H01L 21/00* (2006.01)
*H01L 27/12* (2006.01)
(Continued)

(52) U.S. Cl.
CPC ............ *H01L 27/1262* (2013.01); *G02F 1/13* (2013.01); *G02F 1/1368* (2013.01);
(Continued)

(58) Field of Classification Search
CPC ............ H01L 27/1262; H01L 27/3276; G02F 1/134309
See application file for complete search history.

(56) References Cited

U.S. PATENT DOCUMENTS

2008/0204618 A1* 8/2008 Jung .................... G02F 1/13452
                                                    349/40
2009/0294771 A1* 12/2009 Kim .................. G02F 1/136204
                                                    257/59
2018/0040633 A1*  2/2018 Lee ...................... H01L 27/3276

FOREIGN PATENT DOCUMENTS

CN          101320147 A      12/2008
CN          102566167 A  *    7/2012
(Continued)

OTHER PUBLICATIONS

Search Report for International Patent Application No. PCT/CN2017/075762 dated Jun. 9, 2017.

*Primary Examiner* — Laura Menz
(74) *Attorney, Agent, or Firm* — Calfee, Halter & Griswold LLP

(57) ABSTRACT

A display substrate, a manufacturing method thereof and a display device are provided. The manufacturing method of the display substrate includes: forming a plurality of display substrate regions and a plurality of connection lines on a mother substrate, wherein each of the display substrate regions includes a plurality of peripheral wirings, and the plurality of peripheral wirings of each of the display substrate regions are electrically connected with each other through at least one of the plurality of connection lines; and cutting the mother substrate according to the plurality of
(Continued)

display substrate regions to form a plurality of display substrates, wherein the plurality of peripheral wirings of each of the cut display substrates are disconnected from each other.

17 Claims, 11 Drawing Sheets

(51) Int. Cl.
*G02F 1/13* (2006.01)
*G02F 1/1333* (2006.01)
*G02F 1/1343* (2006.01)
*G02F 1/1362* (2006.01)
*G02F 1/1368* (2006.01)
*H01L 27/32* (2006.01)

(52) U.S. Cl.
CPC .. *G02F 1/133345* (2013.01); *G02F 1/134309* (2013.01); *G02F 1/136286* (2013.01); *H01L 27/124* (2013.01); *H01L 27/3276* (2013.01); *G02F 2201/121* (2013.01); *G02F 2201/123* (2013.01)

(56) References Cited

FOREIGN PATENT DOCUMENTS

| | | |
|---|---|---|
| CN | 106094272 A | 11/2016 |
| JP | 2011232539 A | 11/2011 |

* cited by examiner

DISPLAY SUBSTRATE, MANUFACTURING METHOD THEREOF AND DISPLAY DEVICE

CROSS-REFERENCE TO RELATED APPLICATIONS

This application is based upon International Application No. PCT/CN2017/075762, filed on Mar. 6, 2017, which is based upon and claims priority of Chinese Patent Application No. 201610460915.X filed on Jun. 22, 2016, and titled "display substrate, manufacturing method thereof and display device", which is hereby incorporated by reference in its entirety as part of this application.

TECHNICAL FIELD

The present disclosure relates to the field of the display technology, and more particularly to a display substrate, a manufacturing method thereof and a display device.

BACKGROUND

In the existing display devices, an organic light emitting diode (OLED) has the advantages of simple preparation process, low cost, high luminous efficiency, easy to form flexible structure or the like. A liquid crystal display device (LCD) has the advantages of low power consumption, high display quality, no electromagnetic radiation, wide application range or the like. Organic electroluminescent display device and liquid crystal display device are more important display devices at present.

For example, the existing liquid crystal display device is mainly composed of an array substrate, a counter substrate, and liquid crystal molecules located between the two substrates. Specifically, the array substrate is generally provided with gate lines, data lines, thin film transistors (TFT), pixel electrodes, and a peripheral wiring electrically connected to the gate line and the data line, respectively.

In the process of manufacturing the existing array substrate, for example, in the process of forming for example gate lines, data lines, TFTs, pixel electrodes, and peripheral wirings by using a vacuum plating process, an etching process and so on, the static electricity may be generated between the peripheral wirings insulated from each other. When a glass substrate, which is formed with for example gate lines, data lines, TFTs, pixel electrodes, and peripheral wirings, is transferred by using a roller, an electrostatic breakdown may be caused, thereby affecting the yield of the array substrate.

Therefore, how to avoid static electricity between the insulated peripheral wires is a technical problem that is urgently needed to be solved by those skilled in the art.

SUMMARY

In a first aspect, an embodiment of the present disclosure provides a manufacturing method of a display substrate including: forming a plurality of display substrate regions and a plurality of connection lines on a mother substrate, wherein each of the display substrate regions includes a plurality of peripheral wirings, and the plurality of peripheral wirings of each of the display substrate regions are electrically connected with each other through at least one of the plurality of connection lines; and cutting the mother substrate according to the plurality of display substrate regions to form a plurality of display substrates, wherein the plurality of peripheral wirings of each of the cut display substrates are disconnected from each other.

In a further aspect, a display substrate is provided, which is manufactured by the manufacturing method described as above.

In a further aspect, a display device is provided, which includes the display substrate described as above.

DETAILED DESCRIPTION

Figure 1A:
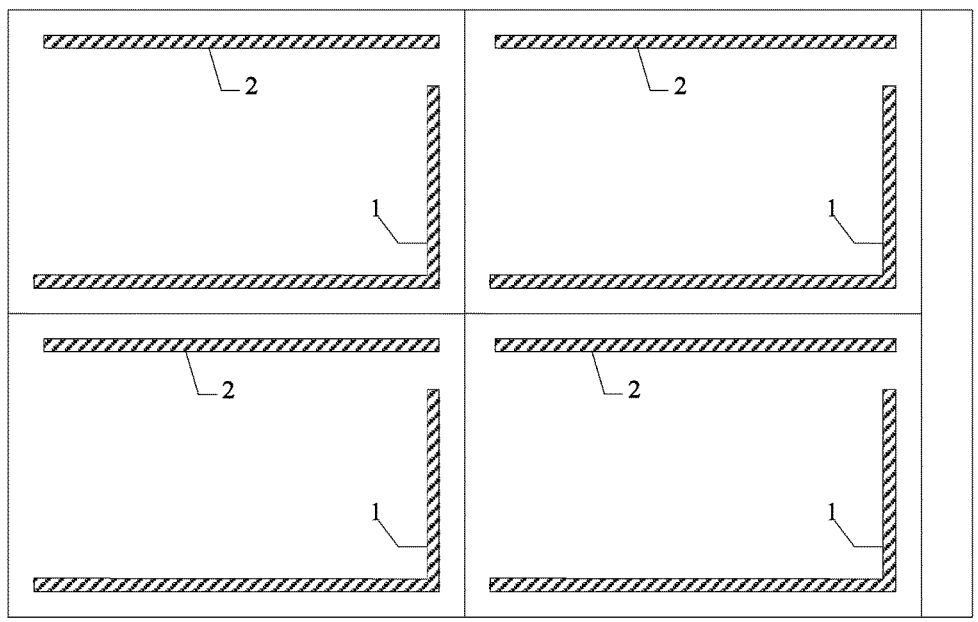
FIGS. 1A-1E are schematic structural diagrams of a manufacturing method after performing corresponding steps according to one embodiment of the present disclosure, respectively.

Hereinafter, specific implementations of a display substrate, a manufacturing method thereof, and a display device of the embodiments of the present disclosure will be described in detail with reference to the accompanying drawings.

A manufacturing method of a display substrate provided by an embodiment of the present disclosure includes steps S101 and S102.

At step S101, a plurality of display substrate regions and a plurality of connection lines are formed on a mother substrate, wherein each of the display substrate regions includes a plurality of peripheral wirings, and the plurality of peripheral wirings of each of the display substrate regions are electrically connected with each other through at least one of the plurality of connection lines.

At step S102, the mother substrate is cut according to the plurality of display substrate regions to form a plurality of display substrates, wherein the plurality of peripheral wirings of each of the cut display substrates are disconnected from each other.

In the above manufacturing method provided by an embodiment of the present disclosure, while a plurality of display substrate regions having peripheral wirings are formed, the connection wire for electrically connecting the insulated peripheral wirings located on each display substrate region is formed. In this way, it is possible to avoid the occurrence of static electricity and even electrostatic breakdown between the peripheral wirings which are insulated from each other, which in turn affects the yield of the display substrate, during the production of the display substrate region by disposing the connection wire to electrically connect the peripheral wirings which are insulated from each other.

In addition, when the mother substrate is cut into a plurality of display substrates later, the connection wire is cut into a plurality of independent sub-connection lines, and different peripheral wirings are electrically connected with different sub-connection lines. Thus it is possible to ensure that different peripheral wirings are insulated from each other, and the display panel can normally display images when the display substrate is applied to the display panel.

It is to be noted that the display substrate formed through the above manufacturing method provided by an embodiment of the present disclosure may be divided into a display region and a peripheral region surrounding the display region, and the peripheral wirings are located in the peripheral region of the display substrate.

In a specific implementation, when the above manufacturing method provided by an embodiment of the present disclosure is performed, the step S101 of forming the plurality of display substrate regions and the plurality of connection lines on the mother substrate may particularly include a step S201.

In step S201, the plurality of first peripheral wirings and the plurality of second peripheral wirings are formed in each of the display substrate regions, wherein the plurality of first peripheral wirings and the plurality of second peripheral wirings are electrically connected with each other through at least one of the plurality of connection lines, the plurality of first peripheral wirings are electrically connected with a common electrode line of each of the display substrate regions, and the plurality of second peripheral wirings are corresponding with and electrically connected with gate lines of each of the display substrate regions, respectively. In this way, by using the connection line to electrically connect the first peripheral wirings electrically connected with the common electrode line and a plurality of second peripheral wirings corresponding with and electrically connected with the gate lines respectively, it is possible to avoid the occurrence of static electricity and even electrostatic breakdown between the first peripheral wirings and the plurality of second peripheral wirings during the vacuum plating process and the etching process which affects the yield of the display substrate.

In a specific implementation, since the number of the plurality of second peripheral wirings which are corresponding with and electrically connected with the gate lines respectively is greater, the workload of electrically connecting the first peripheral wirings electrically connected with the common electrode line with the plurality of second peripheral wirings corresponding with and electrically connected with the gate lines respectively by using the connection line may be larger.

Therefore, when the above manufacturing method provided by an embodiment of the present disclosure is performed, the peripheral wirings of each of the display substrate regions further include a first peripheral bus line, and forming the plurality of display substrate regions and the plurality of connection lines on the mother substrate further includes a step S301.

Figure 5:
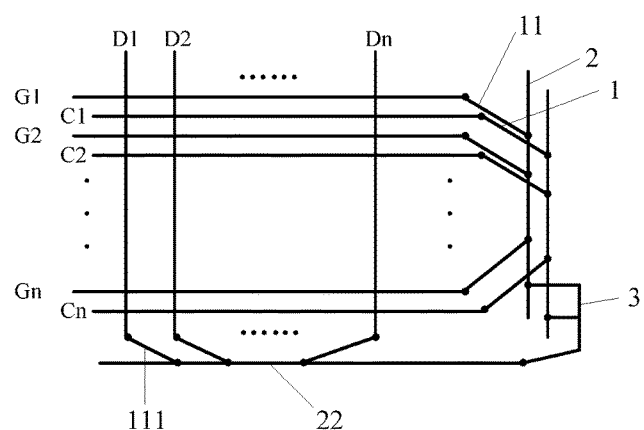
FIG. 5 shows a schematic diagram of a connection way of a connection line according to an embodiment of the present disclosure.

At the step S301, a plurality of display substrate regions having the peripheral wirings and a connection line for electrically connecting the first peripheral wirings and the first peripheral bus line which are insulated from each other on each of the display substrate regions are formed on the mother substrate, wherein the first peripheral wirings are electrically connected with the common electrode line, the first peripheral bus line is electrically connected with each second peripheral wiring, and each second peripheral wiring is electrically connected with a corresponding gate line (as shown in FIG. 5). In this way, by using the connection line to electrically connect the first peripheral wirings electrically connected with the common electrode line and the first peripheral bus line electrically connected with each second peripheral wiring, the electric connection between the first peripheral wirings and the second peripheral wirings may be achieved, which may not only avoid the occurrence of static electricity and even electrostatic breakdown between the first peripheral wirings and the plurality of second peripheral wirings during the vacuum plating process and the etching process which affects the yield of the display substrate, but also may simplify the manufacturing process of the display substrate.

In addition, after the step of cutting the mother substrate according to the plurality of display substrate regions to form the plurality of display substrates, the first peripheral bus line is electrically disconnected from each of the second peripheral wirings. For example, it is possible to electrically disconnect the first peripheral bus line from each of the second peripheral wires by a treatment process such as a cutting process or an etching process, and the process of electrically disconnecting the two is not limited thereto.

It is to be noted that, the first peripheral bus line electrically connected with each of the second peripheral wirings is specifically used for electrical detection. The first peripheral bus line is electrically connected with each gate line through the corresponding second peripheral wiring, and the voltage is applied to each gate line by applying a voltage to the first peripheral bus line. In particular, the number of the first peripheral bus lines may be one, that is, each of the gate lines is electrically connected with one first peripheral bus line through a corresponding second peripheral wiring. Alternatively, the number of the first peripheral bus lines may also be two. For example, the odd-row gate lines are electrically connected with one first peripheral bus line through the corresponding second peripheral wirings, and the even-row gate lines are electrically connected with the other first peripheral bus line through the corresponding second peripheral wirings, which are not limited herein.

In a specific implementation, when the electrical detection is performed on the display substrate, it is required that the first peripheral bus line is electrically connected with each of the gate lines through each of the second peripheral wirings. When the display substrate is used for a normal display, it is required that the first peripheral bus line is electrically disconnected from each of the gate lines.

In addition, the peripheral wirings of each of the display substrate regions further include a first switch signal line, and the step of forming the plurality of display substrate regions and the plurality of connection lines on the mother substrate further includes: forming the first switch signal line and the plurality of first switch transistors on each of the display substrate regions, wherein the plurality of first switch transistors are respectively corresponding with the plurality of second peripheral wirings, the gate electrodes of the plurality of first switch transistors are connected with the first switch signal line, the source electrodes of the plurality of first switch transistors are connected with the first peripheral bus line, and the drain electrode of each of the first switch transistors is electrically connected with the corresponding second peripheral wiring.

In particular, one switch signal line and a plurality of switch transistors respectively corresponding with the second peripheral wirings may be disposed, and the switch signal line is controlled to turn on each of the switch transistors, thereby controlling the electrical connection between the first peripheral bus line and each of the second peripheral wirings, or the switch signal line is controlled to turn off each of the switch transistors, thereby controlling the electrical disconnection between the first peripheral bus line and each of the second peripheral wirings. In order to prevent the occurrence of the static electricity between the switch signal line and the first peripheral wiring during the vacuum plating process and the etching process, when the above manufacturing method provided by an embodiment of the present disclosure is performed, the step S301 of forming the pattern including the plurality of display substrate regions having the peripheral wirings and the connection line for electrically connecting the first peripheral wirings and the first peripheral bus line which are insulated from each other on each of the display substrate regions on the mother substrate particularly includes a step S401.

Figure 6:
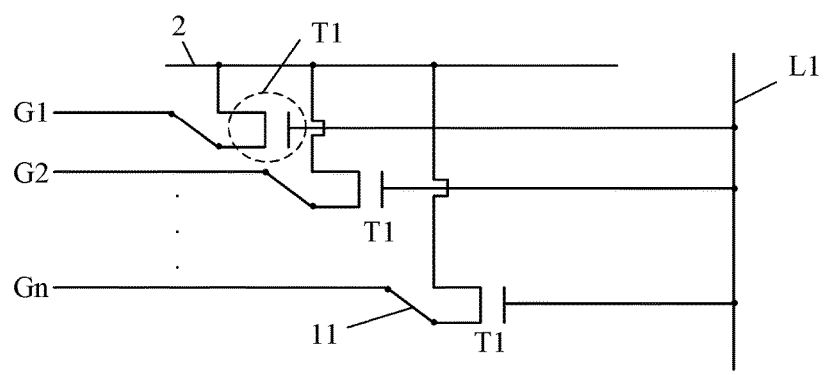
FIGS. 6 and 7 respectively show the connection ways of the first switch transistor and the second switch transistor according to an embodiment of the present disclosure.

At the step S401, the plurality of display substrate regions having the peripheral wirings and the connection line for electrically connecting the first peripheral wirings, the first peripheral bus line and the first switch signal line ("L1" shown in FIG. 6) which are insulated from each other on each of the display substrate regions are formed on the mother substrate, wherein the first peripheral wirings are electrically connected with the common electrode line, the first peripheral bus line is electrically connected with each of the second peripheral wirings, each of the second peripheral wirings is electrically connected with the corresponding gate line, the first switch signal line is electrically connected respectively with the gate electrodes of the plurality of first switch transistors ("T1" shown in FIG. 6) which are respectively corresponding with the second peripheral wirings, the source electrode of each of the first switch transistors is electrically connected with the first peripheral bus line 2, a drain electrode of each of the first switch transistors is electrically connected with the corresponding second peripheral wiring 11 (referring to FIGS. 5 and 6). In this way, by electrically connecting the first peripheral wirings, the first peripheral bus line and the first switch signal line by using the connection line, it is possible to avoid the occurrence of static electricity and even electrostatic breakdown among the first peripheral wirings, the first peripheral bus line and the first switch signal line during the vacuum plating process and the etching process which affects the yield of the display substrate.

In addition, the peripheral wirings of each of the display substrate regions further include third peripheral wirings, the step of forming the plurality of display substrate regions and the plurality of connection lines on the mother substrate further includes forming the third peripheral wirings and a plurality of data lines on each of the display substrate regions, wherein the plurality of third peripheral wirings are respectively corresponding with and electrically connected with the data lines.

In a specific implementation, when the above manufacturing method provided by an embodiment of the present disclosure is performed, the step S101 of forming the plurality of display substrate regions having the peripheral wirings and the connection line for electrically connecting the peripheral wirings which are insulated from each other on each of the display substrate regions on the mother substrate may particularly include a step S501.

In the step S501, a plurality of display substrate regions having the peripheral wirings and a connection line for electrically connecting the first peripheral wirings and the plurality of the third peripheral wirings which are insulated from each other on each of the display substrate regions are formed on the mother substrate, wherein the first peripheral wirings are electrically connected with the common electrode line, the plurality of third peripheral wirings are respectively corresponding with and electrically connected with the data lines. In this way, by electrically connecting the first peripheral wirings electrically connected with the common electrode line with the plurality of third peripheral wirings which are respectively corresponding with and electrically connected with the data lines by using the connection line, it is possible to avoid the occurrence of static electricity and even electrostatic breakdown between the first peripheral wirings and the plurality of third peripheral wirings during the vacuum plating process and the etching process which affects the yield of the display substrate.

In a specific implementation, since the number of the plurality of third peripheral wirings which are respectively corresponding with and electrically connected with the data lines is greater, the workload of electrically connecting the first peripheral wirings electrically connected with the common electrode line with the plurality of third peripheral wirings respectively corresponding with and electrically connected with the data lines by using the connection line may be larger.

Based on this, when the above manufacturing method provided by an embodiment of the present disclosure is performed, the peripheral wirings of each of the display substrate regions further include a second peripheral bus line, and the step of forming the plurality of display substrate regions and the plurality of connection lines on the mother substrate further includes: forming the second peripheral bus line on each of the display substrate regions, wherein the second peripheral bus line is electrically connected with each of the third peripheral wirings.

In particular, the step S501 of forming the pattern including the plurality of display substrate regions having the peripheral wirings and the connection line for electrically connecting the first peripheral wirings and the plurality of the third peripheral wirings which are insulated from each other on each of the display substrate regions on the mother substrate may particularly include a step S601.

In the step S601, a plurality of display substrate regions having peripheral wirings and a connection line for electrically connecting the first peripheral wirings and the second peripheral bus line which are insulated from each other on each of the display substrate regions are formed on a mother substrate, wherein the first peripheral wirings are electrically connected with the common electrode line, the second peripheral bus line is electrically connected with each of the third peripheral wirings, each of the third peripheral wirings is electrically connected with the corresponding data line. In this way, by using the connection line to electrically connect the first peripheral wirings electrically connected with the common electrode line and the second peripheral bus line electrically connected with each third peripheral wiring, the electric connection between the first peripheral wirings and the third peripheral wirings may be achieved, which may not only avoid the occurrence of static electricity and even electrostatic breakdown between the first peripheral wirings and the plurality of third peripheral wirings during the vacuum plating process and the etching process which affects the yield of the display substrate, but also may simplify the manufacturing process of the display substrate.

In addition, after the step of cutting the mother substrate according to the plurality of display substrate regions to form the plurality of display substrates, the second peripheral bus line is electrically disconnected from each of the third peripheral wirings. In addition, the step of cutting the mother substrate according to the plurality of display substrate regions to form the plurality of display substrates includes: cutting the mother substrate according to the plurality of display substrate regions to form the plurality of display substrates, and simultaneously electrically disconnecting the second peripheral bus line from each of the third peripheral wirings. For example, it is possible to perform the electrical disconnection by a treatment process such as a cutting process or an etching process, and the process of performing the electrical disconnection is not limited thereto.

It is to be noted that, the second peripheral bus line electrically connected with each of the third peripheral wirings is specifically used for electrical detection. The second peripheral bus line is electrically connected with each data line through the corresponding third peripheral wiring, and the voltage is applied to each data line by applying a voltage to the second peripheral bus line. In particular, the number of the second peripheral bus lines may be one, that is, each data line is electrically connected with one second peripheral bus line through the corresponding third peripheral wiring. Alternatively, the number of the second peripheral bus lines may also be two. For example, the odd-column data lines are electrically connected with one second peripheral bus line through the corresponding third peripheral wirings, and the even-column data lines are electrically connected with the other second peripheral bus line through the corresponding third peripheral wirings. Alternatively, the number of the second peripheral bus lines may also be three. For example, the data line electrically connected with a column of pixels having a color resistance of red (R) is electrically connected with the first one of the second peripheral bus lines through the corresponding third peripheral wirings, the data line electrically connected with a column of pixels having a color resistance of green (G) is electrically connected with the second one of the second peripheral bus lines through the corresponding third peripheral wirings, and the data line electrically connected with a column of pixels having a color resistance of blue (B) is electrically connected with the third one of the second peripheral bus lines through the corresponding third peripheral wirings, which are not limited herein.

In a specific implementation, when the electrical detection is performed on the display substrate, it is required that the second peripheral bus line is electrically connected with each of the data lines through each of the third peripheral wirings. When the display substrate is used for a normal display, it is required that the second peripheral bus line is electrically disconnected from each of the data lines. In particular, one switch signal line and a plurality of switch transistors which are respectively corresponding with the third peripheral wirings may be disposed. The switch signal line is controlled to turn on each of the switch transistors, thereby controlling the electrical connection between the second peripheral bus line and each of the third peripheral wirings. Alternatively, the switch signal line is controlled to turn off each of the switch transistors, thereby controlling the electrical disconnection between the second peripheral bus line and each of the third peripheral wirings.

In addition, the peripheral wirings of each of the display substrate regions further include a second switch signal line, and the step of forming the plurality of display substrate regions and the plurality of connection lines on the mother substrate further includes: forming a second switch signal line and a plurality of second switch transistors on each of the display substrate regions, wherein the plurality of second switch transistors are respectively corresponding with the plurality of third peripheral wirings, the gate electrodes of the plurality of the second switch transistors are connected to the second switch signal line, the source electrodes of the plurality of the second switch transistors are connected to the second peripheral bus line, and the drain electrode of each of the second switch transistors is electrically connected with the corresponding second peripheral wiring.

In particular, in order to prevent the occurrence of the static electricity between the switch signal line and the first peripheral wiring during the vacuum plating process and the etching process, when the above manufacturing method provided by an embodiment of the present disclosure is performed, the step S601 of forming the pattern including the plurality of display substrate regions having the peripheral wirings and the connection line for electrically connecting the first peripheral wirings and the second peripheral bus line which are insulated from each other on each of the display substrate regions on the mother substrate particularly includes a step S701.

Figure 7:
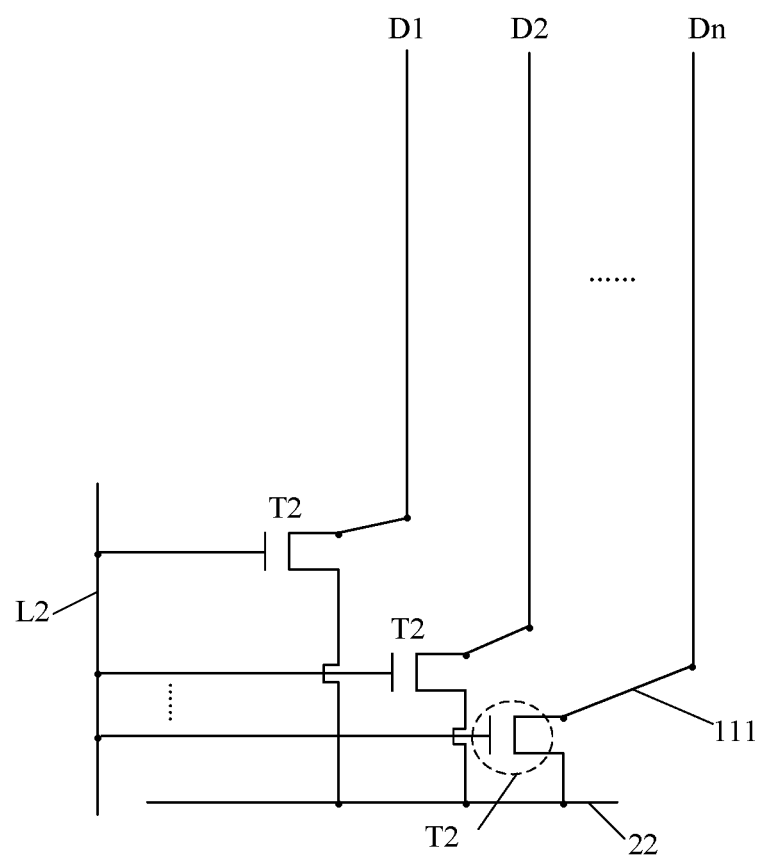

In the step S701, a plurality of display substrate regions having peripheral wirings and a connection line for electrically connecting a first peripheral wiring, a second peripheral bus line and a second switch signal line ("L2" shown in FIG. 7) which are insulated from each other on each of the display substrate regions are formed on the mother substrate, wherein the first peripheral wirings are electrically connected with the common electrode line, the second peripheral bus line is electrically connected with each of the third peripheral wirings, each of the third peripheral wirings is electrically connected with the corresponding data line, the second switch signal line is electrically connected respectively with the gate electrodes of the plurality of the second switch transistors ("T2" shown in FIG. 7) which are respectively corresponding to the third peripheral wirings, the source electrode of each of the second switch transistors is electrically connected with the second peripheral bus line 22, and the drain electrode of each of the second switch transistors is electrically connected with the corresponding third peripheral wiring 111. In this way, by using the connection line to electrically connect the first peripheral wirings, the second peripheral bus line and the second switch signal line, it is possible to avoid the occurrence of static electricity and even electrostatic breakdown among the first peripheral wirings, the second peripheral bus line and the second switch signal line during the vacuum plating process and the etching process which affects the yield of the display substrate.

It is to be noted that, the first peripheral bus line is electrically connected with each of the second peripheral wirings before cutting, and the first peripheral bus line is electrically disconnected from each of the second peripheral wirings after cutting. And/or, the second peripheral bus line is electrically connected with each of the third peripheral wirings before cutting, and the second peripheral bus line is electrically disconnected from each of the third peripheral wirings after cutting.

It is to be noted that it is possible to perform the electrical disconnection by a treatment process such as a cutting process or an etching process, and the process of performing the electrical disconnection is not limited thereto.

It is to be noted that, in the above manufacturing method provided by an embodiment of the present disclosure, the peripheral wirings which generate static electricity during the vacuum plating process and the etching process are not limited to the first peripheral wirings and the second peripheral wirings, the first peripheral wirings and the first peripheral bus line, the first peripheral wirings and the first switch signal line, the first peripheral wirings and the third peripheral wirings, the first peripheral wirings and the second peripheral bus line, and the first peripheral wirings and the second switch signal line. For example, the peripheral wirings may further include a repair line for repairing a broken gate line or data line when a problem that the gate line or data line is broken occurs, and Vgl signal line, Vgh signal line and Vds signal line used for the electrical detection and so on, and static electricity may also be generated between these peripheral wirings during the vacuum plating process and the etching process, such that the connection line is used to connect any two or more of the above peripheral wirings, which are within the protection scope of the present disclosure.

In a specific implementation, the display substrate formed by the above manufacturing method provided by an embodiment of the present disclosure may be applied to an organic light emitting diode (OLED), or may be also applied to a liquid crystal display (LCD) device, which is not limited herein. The following embodiments are illustrated by applying the display substrate to the LCD, for example.

In a specific implementation, when the display substrate formed by the above manufacturing method provided by an embodiment of the present disclosure is applied to the LCD, it may be applied to a twisted nematic (TN) LCD, that is, the above display substrate includes pixel electrodes. Alternatively, it may also be applied to an advanced super dimension switch (ADS) and an in-plane switch (IPS) LCD, that is, the above display substrate includes pixel electrodes and a common electrode insulated from the pixel electrode, which are not limited herein.

In particular, in the above manufacturing method provided by an embodiment of the present disclosure, when the display substrate formed by the above manufacturing method provided by an embodiment of the present disclosure is applied to the TN LCD, ADS LCD or IPS LCD, the pattern of the connection line and the pixel electrode may be simultaneously formed by the same patterning process. Or, the pattern of the connection line, the source electrode, the drain electrode and the data line may also be simultaneously formed by the same patterning process. Or, the pattern of connection line, the gate electrode and the gate line may also be simultaneously formed by the same patterning process. When the display substrate formed by the above manufacturing method provided by an embodiment of the present disclosure is applied to the ADS LCD or IPS LCD, the pattern of the connection line and the common electrode may also be simultaneously formed by the same patterning process, which is not limited herein.

The specific implementations of the above manufacturing method provided by an embodiment of the present disclosure are described in detail below through four specific embodiments when the connection line is respectively formed through the above four ways.

Embodiment 1: the pattern of the connection line and the pixel electrode is simultaneously formed by the same patterning process.

In a specific implementation, in the above manufacturing method provided by an embodiment of the present disclosure, forming the pattern including the connection line may be particularly achieved by the following way: forming the pattern including the connection line while forming the pattern including the pixel electrode. Thus the formation of the connection line may not increase the number of the masking during the manufacturing process of the display substrate.

The specific process of the above manufacturing method is described in detail below by taking the bottom gate type thin film transistor as an example.

As shown in FIG. 1A, and by referring to FIGS. 5 and 6, first, a pattern including a gate electrode, gate lines G1, . . . , Gn (hereinafter referred to as "gate line(s)"), a common electrode line C1, C2, . . . , Cn (hereinafter referred to as "common electrode line"), first peripheral wirings 1 electrically connected with the common electrode line, a plurality of second peripheral wirings 11 electrically connected with each of the gate lines and a first peripheral bus line 2 electrically connected with each of the second peripheral wirings 11 is formed on a mother substrate.

In particular, the common electrode line and the first peripheral wirings 1 electrically connected with the common electrode line may also be disposed on a layer which is different from the layer where the gate electrode and the gate line are located, which is not limited herein.

Next, a pattern including a gate insulation layer and an active layer is formed on the mother substrate formed with the pattern of the gate electrode, the gate lines, the common electrode line, the first peripheral wirings, the second peripheral wirings and the first peripheral bus line.

Figure 1B:
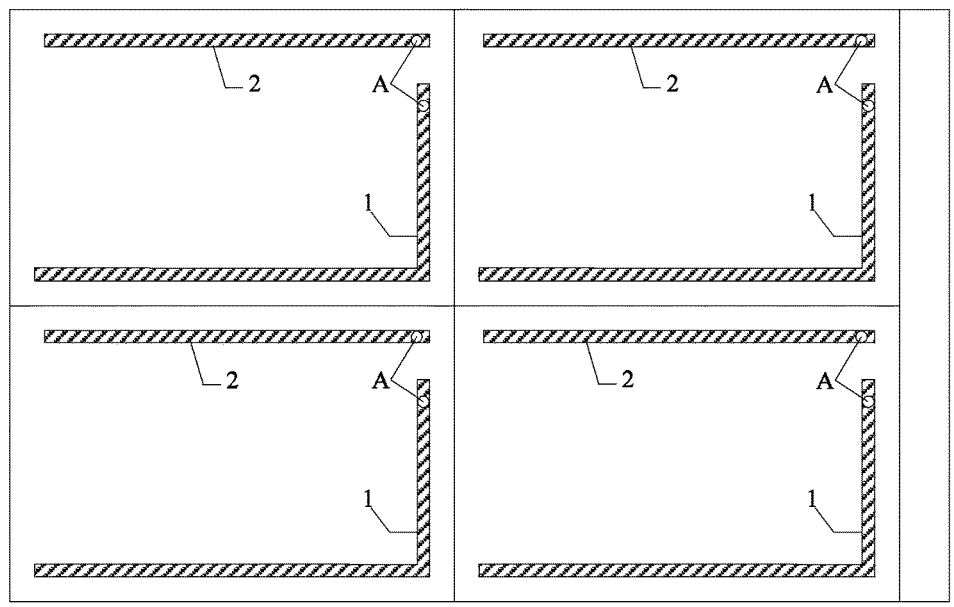

Next, as shown in FIG. 1B, first via holes A are formed in the gate insulation layer which is just above the first peripheral wirings 1 and the first peripheral bus line 2.

Figure 1C:
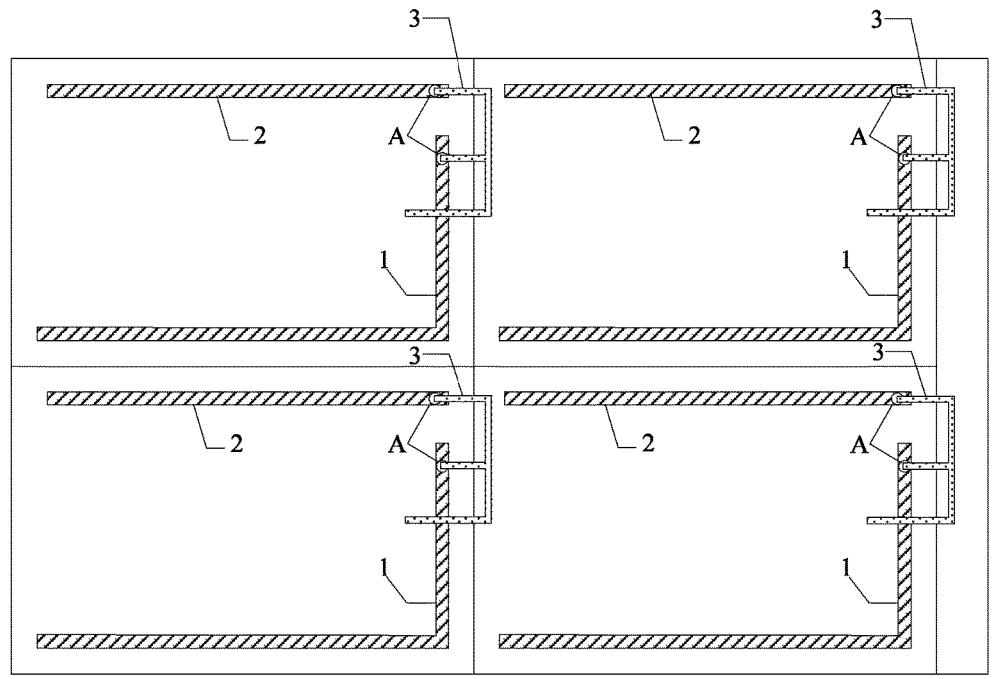

Next, as shown in FIG. 1C, a pattern including pixel electrodes (not shown) and a connection line 3 is formed on the mother substrate formed with the first via holes A, wherein the connection line 3 is electrically connected with the first peripheral wirings 1 and the first peripheral bus line 2 through the first via holes A, respectively.

In particular, it is also possible to form the via hole in the gate insulation layer located just above the first peripheral wirings and each of the second peripheral wirings in the step 3, and the connection line is electrically connected with the first peripheral wirings and each of the second peripheral wirings respectively through such via hole in the step 4, which are not limited herein.

Figure 1D:
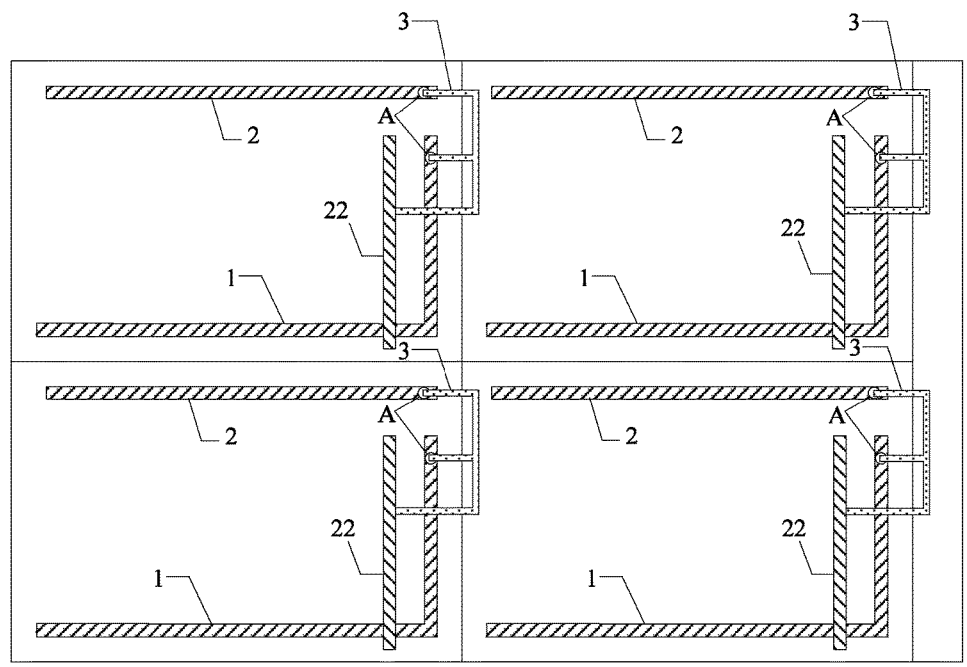

Next, as shown in FIGS. 1D and 5, the pattern including a source electrode, a drain electrode, data lines D1, D2, . . . , Dn (hereinafter referred to as "data line"), a plurality of third peripheral wirings electrically connected with the corresponding data line and a second peripheral bus line 22 electrically connected with each of the third peripheral wirings is formed on the mother substrate formed with the pattern of the pixel electrode and the connection line 3, wherein the second peripheral bus line 22 is electrically connected with connection line 3 (step 5).

In particular, each of the third peripheral wirings may also be electrically connected with the connection line, which is not limited herein.

Figure 1E:
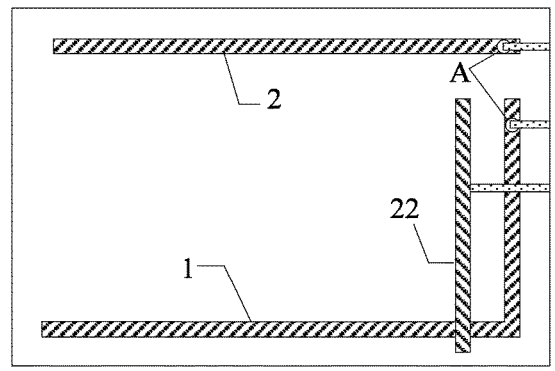

Then, the mother substrate is cut into a plurality of display substrates, wherein the connection line is cut into a plurality of independent sub-connection lines, and different peripheral wirings are electrically connected with different sub-connection lines. That is, the peripheral wirings are insulated from each other. The mother substrate is cut to obtain four display substrates, and one of the display substrates is shown in FIG. 1E.

Embodiment 2: the pattern of a connection line, a source electrode, a drain electrode and a data line is simultaneously formed by the same patterning process.

In a specific implementation, in the above manufacturing method provided by an embodiment of the present disclosure, forming the pattern including the connection line may be particularly achieved by the following way: forming the pattern including the connection line while forming the pattern including the source electrode, the drain electrode and the data line. Thus the formation of the connection line may not increase the number of the masking during the manufacturing process of the display substrate.

The specific process of the above manufacturing method is described in detail below by taking the bottom gate type thin film transistor as an example.

Figure 2A:
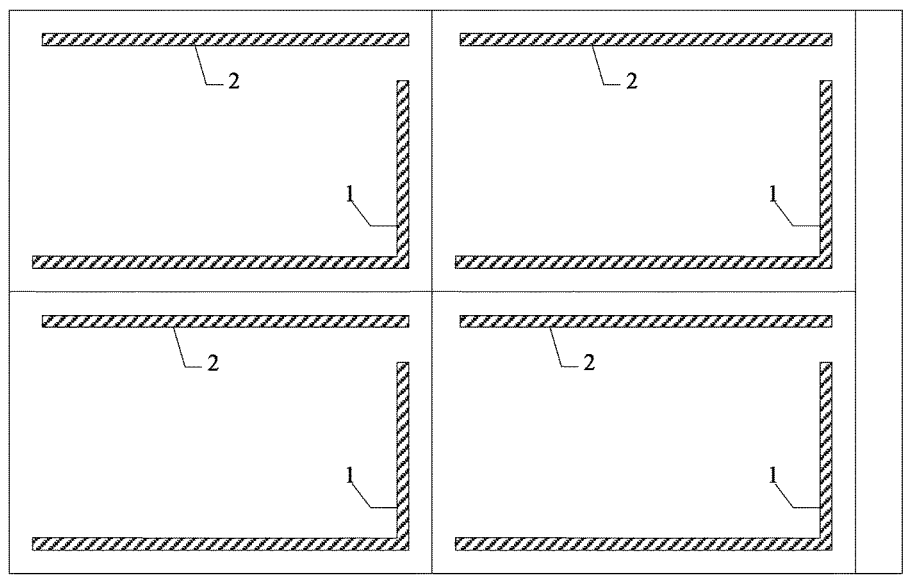
FIGS. 2A-2D are schematic structural diagrams of a manufacturing method after performing corresponding steps according to another embodiment of the present disclosure, respectively.

First, as shown in FIG. 2A, and by referring to FIGS. 5 and 6, a pattern including a gate electrode, a gate line, a common electrode line, the first peripheral wirings 1 electrically connected with the common electrode lines, a plurality of second peripheral wirings 11 electrically connected with the gate lines and a first peripheral bus line 2 electrically connected with each of the second peripheral wirings 11 is formed on a mother substrate (step 1).

In particular, the common electrode line and the first peripheral wirings electrically connected with the common electrode line may also be disposed on a layer which is different from the layer where the gate electrode and the gate line are disposed, which is not limited herein.

Next, a pattern including a gate insulation layer and an active layer is formed on the mother substrate formed with the pattern including the gate electrode, the gate line, the common electrode line, the first peripheral wirings, the second peripheral wirings and the first peripheral bus line (step 2).

Figure 2B:
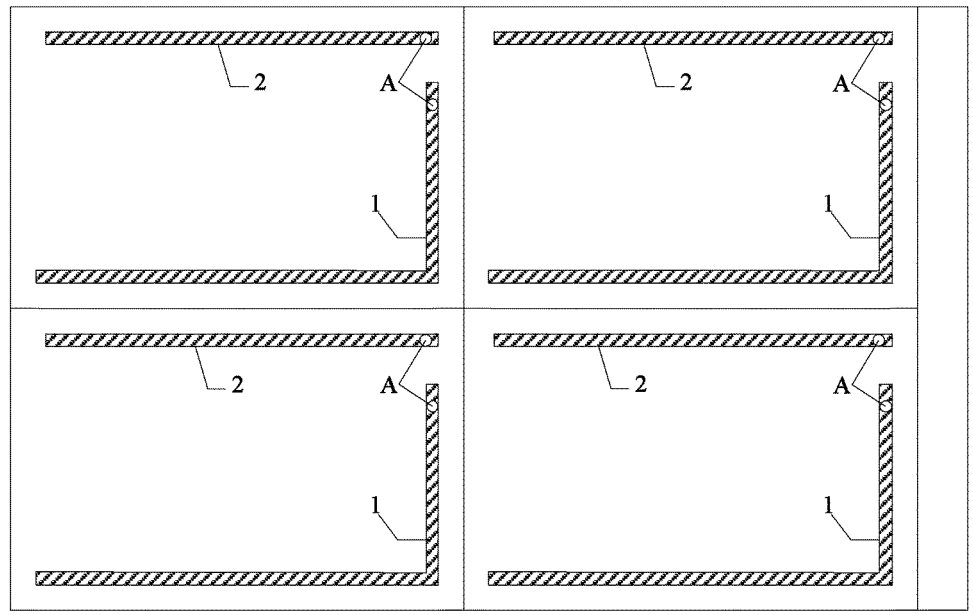

Next, as shown in FIG. 2B, first via holes A are formed in a gate insulation layer which is just above the first peripheral wirings 1 and the first peripheral bus line 2 (step 3).

Figure 2C:
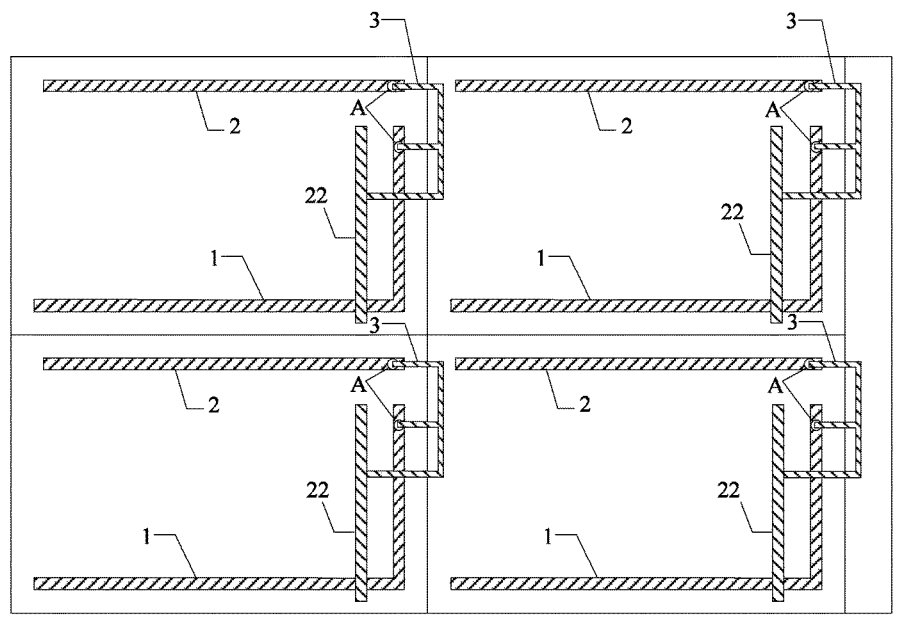

Next, as shown in FIG. 2C, a pattern including the source electrode, the drain electrode, the data line, a plurality of third peripheral wirings electrically connected with the data lines, a second peripheral bus line 22 electrically connected with each of the third peripheral wirings and a connection line 3 electrically connected with the second peripheral bus line 22 is formed on the mother substrate formed with the first via holes A, wherein the connection line 3 is electrically connected with the first peripheral wirings 1 and the first peripheral bus line 2 through the first via holes A, respectively (step 4).

In particular, it is also possible to form the via holes in the gate insulation layer located just above the first peripheral wirings and each of the second peripheral wirings in the step 3, and the connection line is electrically connected with the first peripheral wirings and each of the second peripheral wirings through such via holes respectively in the step 4, which are not limited herein. Also, the connection line may be electrically connected with each of the third peripheral wirings in step 4, which are not limited herein.

Next, a pattern including pixel electrodes is formed on the mother substrate formed with the pattern including the source electrode, the drain electrode, the data line, the third peripheral wirings and the connection line (step 5).

Figure 2D:
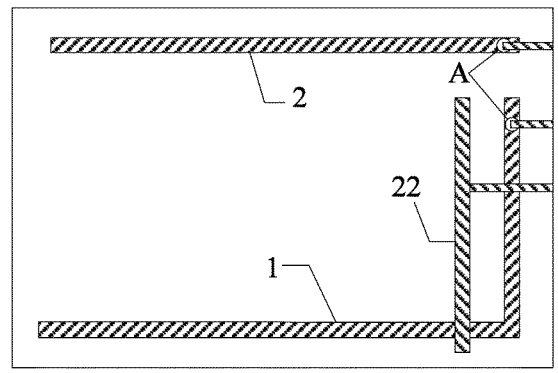

Then, the mother substrate is cut into a plurality of display substrates, wherein the connection line is cut into a plurality of independent sub-connection lines, and different peripheral wirings are electrically connected with different sub-connection lines. That is, the peripheral wirings are insulated from each other (step 6). The mother substrate is cut to obtain four display substrates, and one of the display substrates is shown in FIG. 2D.

Embodiment 3: the pattern of a connection line, a gate electrode and gate lines is simultaneously formed by the same patterning process.

In a specific implementation, in the above manufacturing method provided by an embodiment of the present disclosure, forming the pattern including the connection line may be particularly achieved by the following way: forming the pattern including the connection line while forming the pattern including the gate electrode and the gate line. Thus the formation of the connection line may not increase the number of the masking during the manufacturing process of the display substrate.

The specific process of the above manufacturing method is described in detail below by taking the bottom gate type thin film transistor as an example.

Figure 3A:
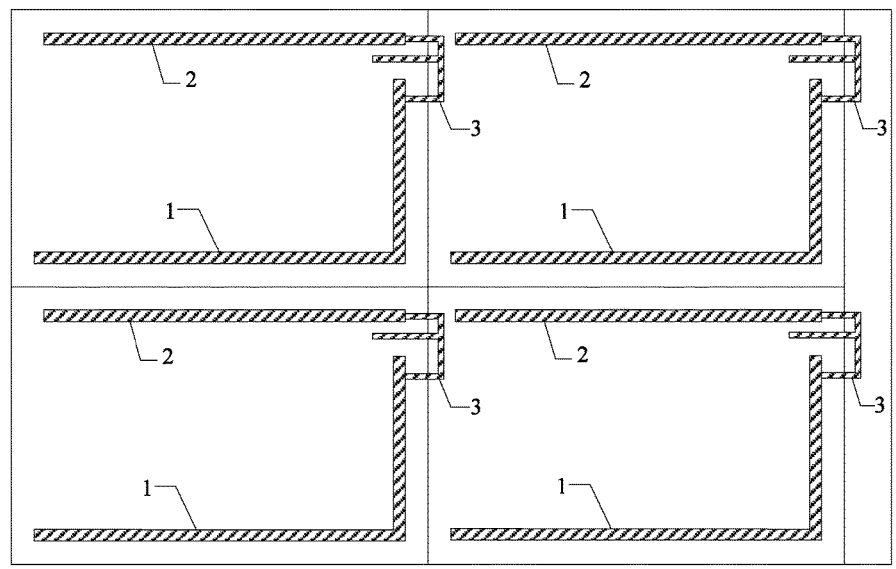
FIGS. 3A-3D are schematic structural diagrams of a manufacturing method after performing corresponding steps according to yet another embodiment of the present disclosure, respectively.

First, as shown in FIG. 3A, and by referring to FIGS. 5 and 6, a pattern including a gate electrode, gate lines, a common electrode line, first peripheral wirings 1 electrically connected with the common electrode line, a plurality of second peripheral wirings electrically connected with the gate lines, a first peripheral bus line 2 electrically connected with each of the second peripheral wirings and a connection line 3 electrically connected with the first peripheral wirings 1 and the first peripheral bus line 2 respectively is formed on a mother substrate (step 1).

In particular, the common electrode line and the first peripheral wiring electrically connected with the common electrode line may also be disposed on a layer which is different from the layer where the gate electrode and the gate line are located, which is not limited herein. Also, the connection line may also be electrically connected with the first peripheral wirings and each of the second peripheral wirings respectively, which is not limited herein.

Next, a pattern including a gate insulation layer and an active layer is formed on the mother substrate formed with the pattern including the gate electrode, the gate line, the common electrode line, the first peripheral wirings, the second peripheral wirings and the connection line (step 2).

Figure 3B:
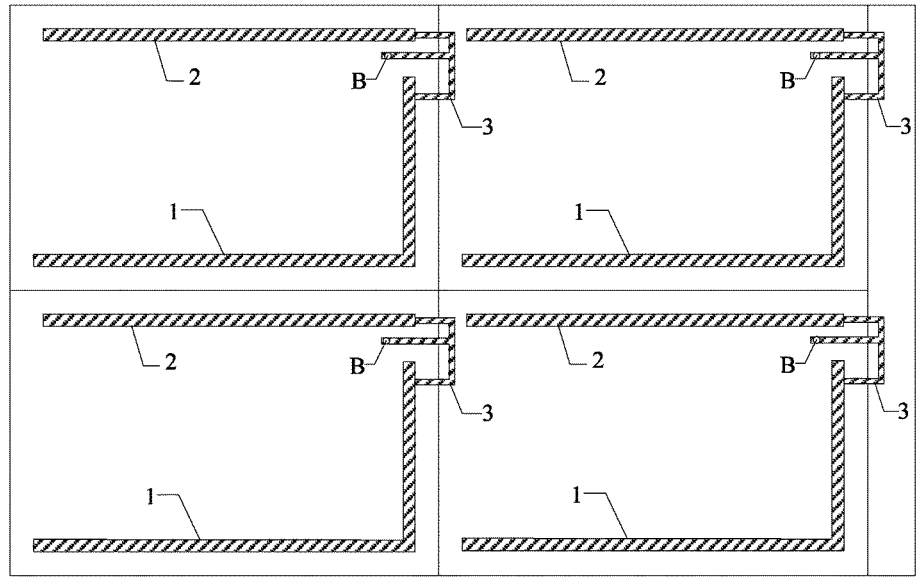

Next, as shown in FIG. 3B, second via holes B are formed in the gate insulation layer located just above the connection line 3.

Figure 3C:
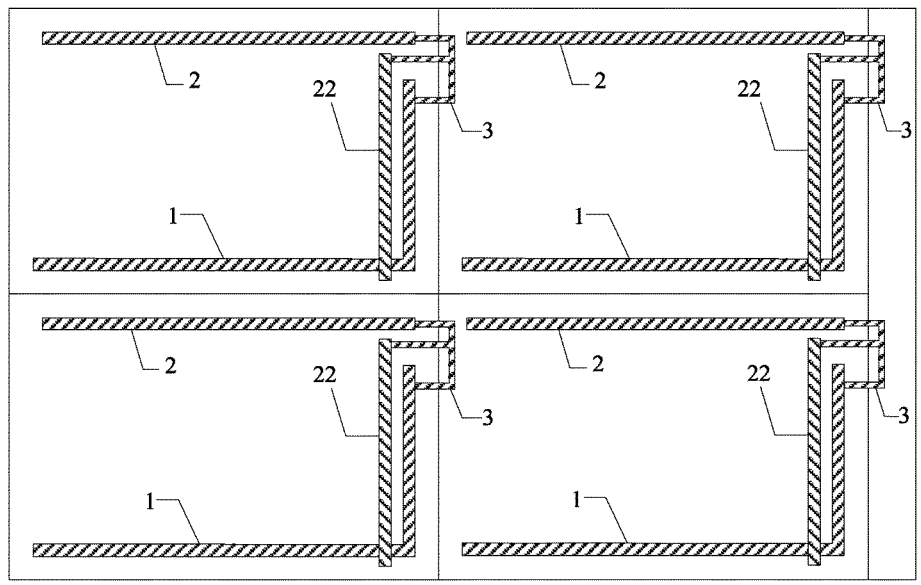

Next, as shown in FIG. 3C, a pattern including a source electrode, a drain electrode, a data line, a plurality of third peripheral wirings electrically connected with each of the data lines and a second peripheral bus line 22 electrically connected with each of the third peripheral wirings is formed on the mother substrate formed with the second via holes B, wherein the second peripheral bus line 22 is electrically connected with the connection line 3 through the second via holes B.

In particular, each of the third peripheral wirings may also be electrically connected with the connection line through the second via holes, which is not limited herein.

Next, a pattern including pixel electrodes is formed on the mother substrate formed with the pattern including the source electrode, the drain electrode, the data line and the third peripheral wirings (step 5).

Figure 3D:
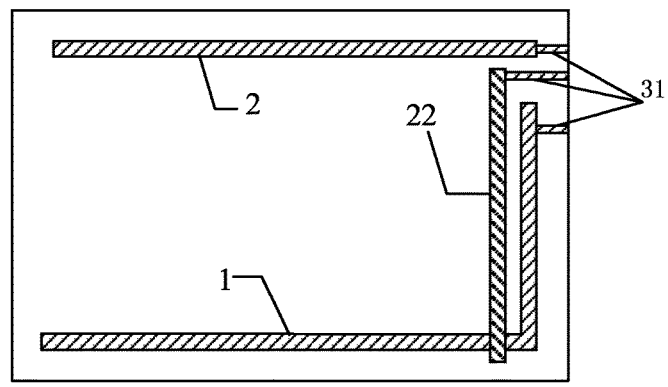

Then, the mother substrate is cut into a plurality of display substrates, wherein the connection line is cut into a plurality of independent sub-connection lines 31, and different peripheral wirings are electrically connected with different sub-connection lines. That is, the peripheral wirings are insulated from each other (step 6). The mother substrate is cut to obtain four display substrates, and one of the display substrates is shown in FIG. 3D.

Embodiment 4: a pattern including a connection line and a common electrode is simultaneously formed by the same patterning process.

In a specific implementation, in the above manufacturing method provided by an embodiment of the present disclosure, forming the pattern including the connection line may be particularly achieved by the following way: forming the pattern including the connection line while forming the pattern including the common electrode. Thus the formation of the connection line may not increase the number of the masking during the manufacturing process of the display substrate.

The specific process of the above manufacturing method is described in detail below by taking the bottom gate type thin film transistor as an example.

Figure 4A:
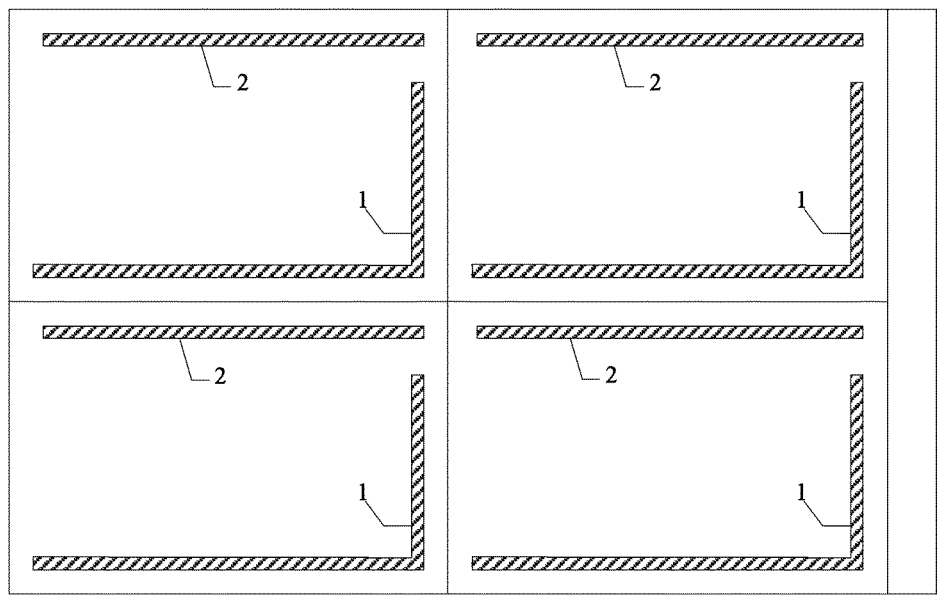
FIGS. 4A-4E are schematic structural diagrams of a manufacturing method after performing corresponding steps according to yet another embodiment of the present disclosure, respectively.

First, as shown in FIG. 4A, and by referring to FIGS. 5 and 6, a pattern including a gate electrode, gate lines, a common electrode line, first peripheral wirings 1 electrically connected with the common electrode line, a plurality of second peripheral wirings electrically connected with each of the gate lines and a first peripheral bus line 2 electrically connected with each of the second peripheral wirings is formed on a mother substrate (step 1).

In particular, the common electrode line and the first peripheral wirings electrically connected with the common electrode line may also be disposed on a layer which is different from the layer where the gate electrode and the gate line are located, which is not limited herein.

Next, a pattern including a gate insulation layer and an active layer is formed on the mother substrate formed with the pattern including the gate electrode, the gate line, the common electrode line, the first peripheral wirings and the second peripheral wirings.

Next, a pattern including pixel electrodes is formed on the mother substrate formed with the pattern of the gate insulation layer and the active layer (step 3).

Figure 4B:
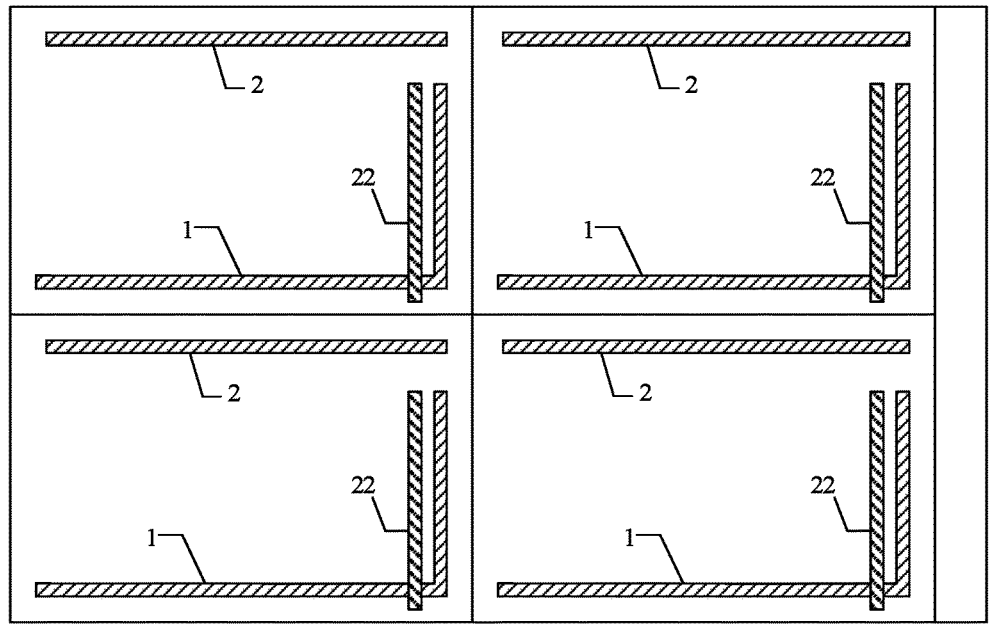

Next, as shown in FIG. 4B, a pattern including the source electrode, the drain electrode, the data line, the plurality of third peripheral wirings electrically connected with the data lines and the second peripheral bus line 22 electrically connected with each of the third peripheral wirings is formed on the mother substrate formed with the pattern including the pixel electrode (step 4).

Next, a passivation layer is formed on the mother substrate formed with the pattern of the source electrode, the drain electrode, the data line and the third peripheral wirings (step 5).

Figure 4C:
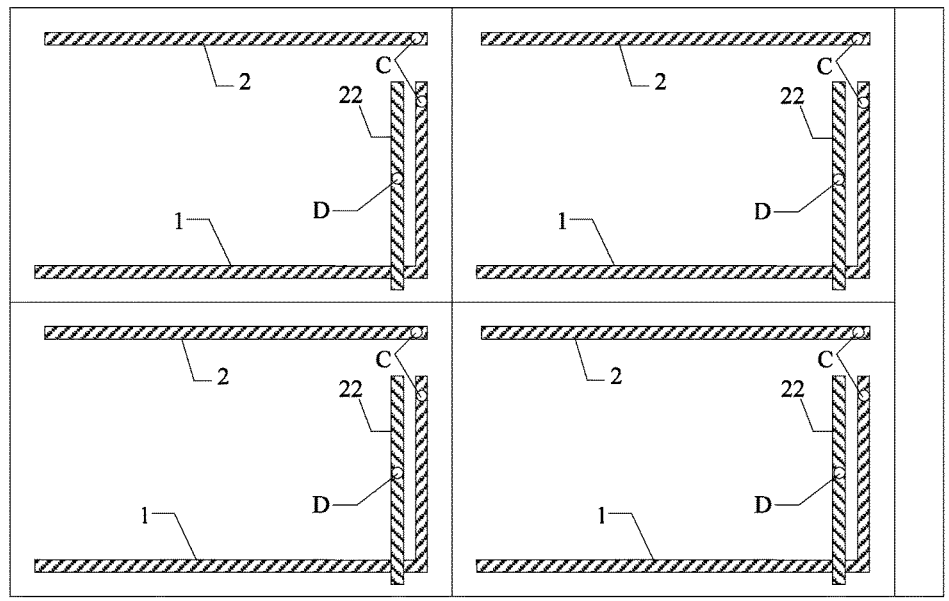

Next, as shown in FIG. 4C, a third via hole C is formed in the gate insulation layer and the passivation layer located just above the first peripheral wirings 1 and the first peripheral bus line 2, and a fourth via hole D is formed in the passivation layer located just above the second peripheral bus line 22 (step 6).

Figure 4D:
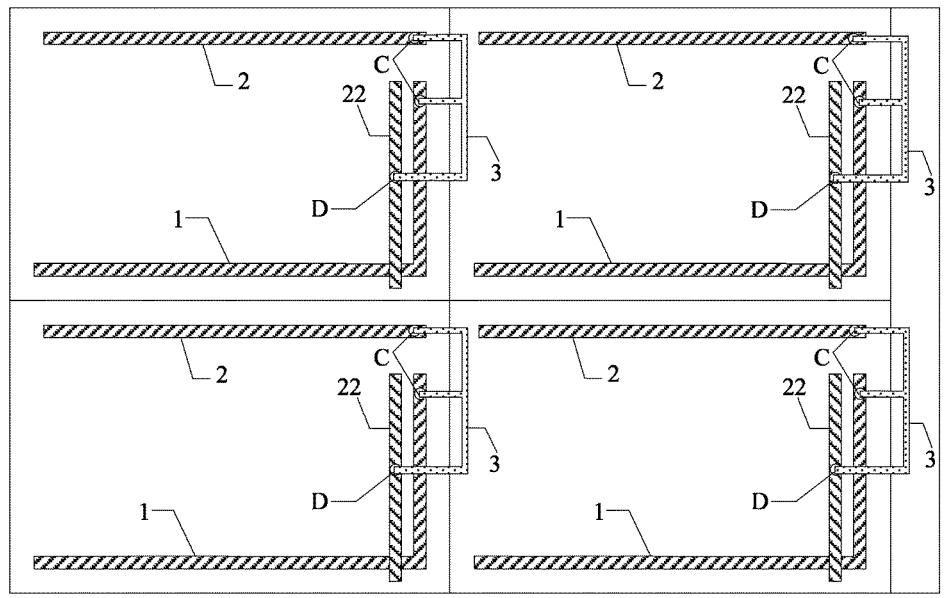

Next, as shown in FIG. 4D, a pattern including a common electrode and a connection line 3 is formed on the mother substrate formed with the third via hole C and the fourth via hole D, wherein the connection line 3 is electrically connected with the first peripheral wirings 1 and the first peripheral bus line 2 through the third via hole C, respectively, and the connection line 3 is electrically connected with the second peripheral bus line 22 through the fourth via hole D (step 7).

In particular, it is also possible to form the via hole in the gate insulation layer and the passivation layer located just above the first peripheral wirings and each of the second peripheral wirings in the step 6, and the connection line is electrically connected with the first peripheral wirings and each of the second peripheral wirings through such via hole in the step 7, which are not limited herein. It is also possible to form the via hole in the passivation layer located just above each of the third peripheral wirings in the step 6, and the connection line is electrically connected with each of the third peripheral wirings through such via hole in the step 7, which are not limited herein.

Figure 4E:
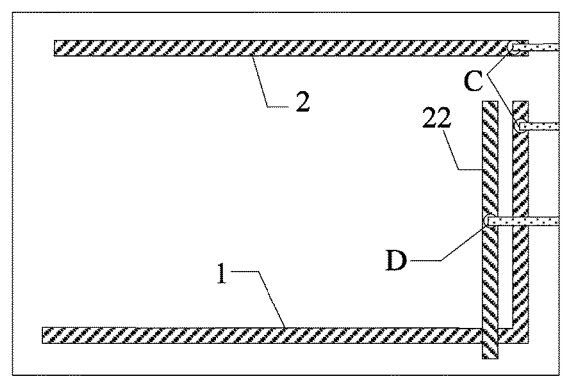

Then, the mother substrate is cut into a plurality of display substrates, wherein the connection line is cut into a plurality of independent sub-connection lines, and different peripheral wirings are electrically connected with different sub-connection lines. That is, the peripheral wirings are insulated from each other (step 8). The mother substrate is cut to obtain four display substrates, and one of the display substrates is shown in FIG. 4E.

It is to be noted that the above manufacturing method provided by an embodiment of the present disclosure is not limited to the four embodiments provided as above, the embodiments described as above are only part of the embodiments of the present disclosure, and are not all of the embodiments. All other embodiments obtained by one of ordinary skill in the art based on the described embodiments of the present disclosure without creative labor are within the scope of this disclosure.

Based on the same inventive concept, an embodiment of the present disclosure further provides a display substrate which is the display substrate manufactured by the above manufacturing method provided by an embodiment of the present disclosure. The implementation of the display substrate may refer to the embodiments of the manufacturing method of the above display substrate, and the same contents are not repeated any longer.

Based on the same inventive concept, an embodiment of the present disclosure further provides a display device including the above display substrate provided by the embodiments of the present disclosure. The display device can be any products or components having display function, such as mobile phones, tablet PCs, televisions, monitors, laptops, digital photo frames, navigators and so on. The implementation of the display device may refer to the embodiments of the above display substrate, and the same contents are not repeated any longer.

In the display substrate, the manufacturing method thereof and the display device provided by the embodiments of the present disclosure, in the manufacturing method of the display substrate, while a plurality of display substrates having peripheral wirings are formed, a pattern of connection wires for electrically connecting the insulated peripheral wirings located on each display substrate is formed. In this way, it is possible to avoid the occurrence of static electricity and even electrostatic breakdown between the peripheral wirings which are insulated from each other, which affects the yield of the display substrate, during the production of the display substrate by disposing the connection wires to electrically connect the peripheral wirings which are insulated from each other. Then, when the mother substrate is cut into a plurality of display substrates, the connection line is cut into a plurality of independent sub-connection lines, and different peripheral wirings are electrically connected with different sub-connection lines. Therefore, it is possible to ensure that different peripheral wirings are insulated from each other, and the display panel can normally display images when the display substrate is applied to the display panel.

It will be apparent to those skilled in the art that various changes and modifications can be made in the present disclosure without departing from the spirit and scope of the present disclosure. In this way, the present disclosure is intended to embrace such variations and variations if these modifications and variations of the present disclosure are within the scope of the claims of the present disclosure and the equivalents thereof.

What is claimed is:

1. A manufacturing method of a display substrate, comprising:

forming a plurality of display substrate regions and a plurality of connection lines on a mother substrate, wherein each of the display substrate regions comprises a plurality of peripheral wirings, and the plurality of peripheral wirings of each of the display substrate regions are electrically connected with each other through at least one of the plurality of connection lines; and cutting the mother substrate according to the plurality of display substrate regions to form a plurality of display substrates, wherein the plurality of peripheral wirings of each of the cut display substrates are disconnected from each other, wherein the peripheral wirings comprise a plurality of first peripheral wirings and a plurality of second peripheral wirings, and the step of forming the plurality of display substrate regions and the plurality of connection lines on the mother substrate comprises:

forming the plurality of first peripheral wirings and the plurality of second peripheral wirings in each of the display substrate regions, wherein the plurality of first peripheral wirings and the plurality of second peripheral wirings are electrically connected with each other through at least one of the plurality of connection lines, the plurality of first peripheral wirings are electrically connected with common electrode lines of each of the display substrate regions, and the plurality of second peripheral wirings are corresponding with and electrically connected with gate lines of each of the display substrate regions, respectively, wherein the peripheral wirings of each of the display substrate regions further comprise a first peripheral bus line, and the step of forming the plurality of display substrate regions and the plurality of connection lines on the mother substrate further comprises:

forming the first peripheral bus line in each of the display substrate regions, wherein the first peripheral bus line is electrically connected with each of the second peripheral wirings, wherein the peripheral wirings of each of the display substrate regions further comprise a first switch signal line, and the step of forming the plurality of display substrate regions and the plurality of connection lines on the mother substrate further comprises:

forming the first switch signal line and a plurality of first switch transistors in each of the display substrate regions, wherein the plurality of first switch transistors are corresponding with the plurality of second peripheral wirings, respectively, gate electrodes of the plurality of first switch transistors are connected to the first switch signal line, source electrodes of the plurality of first switch transistors are connected to the first peripheral bus line, and a drain electrode of each of the first switch transistors is electrically connected with a corresponding second peripheral wiring.

2. The manufacturing method of claim 1, wherein after the mother substrate is cut, each of the connection lines is cut into a plurality of independent sub-connection lines, different peripheral wirings are electrically connected with different sub-connection lines.

3. The manufacturing method of claim 1, wherein after cutting the mother substrate according to the plurality of display substrate regions to form the plurality of display substrates, electrically disconnecting the first peripheral bus line from each of the second peripheral wirings.

4. The manufacturing method of claim 1, wherein the step of cutting the mother substrate according to the plurality of display substrate regions to form the plurality of display substrates comprises:

cutting the mother substrate according to the plurality of display substrate regions to form the plurality of display substrates and simultaneously electrically disconnecting the first peripheral bus line from each of the second peripheral wirings.

5. The manufacturing method of claim 1, wherein the peripheral wirings of each of the display substrate regions further comprise a plurality of third peripheral wirings, and the step of forming the plurality of display substrate regions and the plurality of connection lines on the mother substrate further comprises:

forming the plurality of third peripheral wirings and a plurality of data lines in each of the display substrate regions, wherein the plurality of third peripheral wirings are corresponding with and electrically connected with the plurality of data lines, respectively.

6. The manufacturing method of claim 5, wherein the peripheral wirings of each of the display substrate regions further comprise a second peripheral bus line, and the step of forming the plurality of display substrate regions and the plurality of connection lines on the mother substrate further comprises:

forming the second peripheral bus line in each of the display substrate regions, wherein the second peripheral bus line is electrically connected with each of the third peripheral wirings.

7. The manufacturing method of claim 6, wherein after cutting the mother substrate according to the plurality of display substrate regions to form the plurality of display substrates, electrically disconnecting the second peripheral bus line from each of the third peripheral wirings.

8. The manufacturing method of claim 6, wherein the step of cutting the mother substrate according to the plurality of display substrate regions to form the plurality of display substrates comprises:

cutting the mother substrate according to the plurality of display substrate regions to form the plurality of display substrates and simultaneously electrically disconnecting the second peripheral bus line from each of the third peripheral wirings.

9. The manufacturing method of claim 6, wherein the peripheral wirings of each of the display substrate regions further comprise a second switch signal line, and the step of forming the plurality of display substrate regions and the plurality of connection lines on the mother substrate further comprises:

forming the second switch signal line and a plurality of second switch transistors in each of the display substrate regions, wherein the plurality of second switch transistors are corresponding with the plurality of third peripheral wirings, respectively, gate electrodes of the plurality of second switch transistors are all connected to the second switch signal line, source electrodes of the plurality of second switch transistors are all connected to the second peripheral bus line, and a drain electrode of each of the second switch transistors is electrically connected with a corresponding second peripheral wiring.

10. The manufacturing method of claim 1 further comprising:
   forming pixel electrodes in each of the display substrate regions,
   wherein the pixel electrode and the plurality of connection lines are formed simultaneously.

11. The manufacturing method of claim 1 further comprising:
   forming thin film transistors and data lines in each of the display substrate regions,
   a source electrode and a drain electrode of the thin film transistor, the data lines and the plurality of connection lines are formed simultaneously.

12. The manufacturing method of claim 1 further comprising:
   forming thin film transistors and gate lines in each of the display substrate regions,
   wherein a gate electrode of the thin film transistor, the gate lines and the plurality of connection lines are formed simultaneously.

13. The manufacturing method of claim 1 further comprising:
   forming a common electrode in each of the display substrate regions,
   wherein the common electrode and the plurality of connection lines are formed simultaneously.

14. A display substrate, which is manufactured by the manufacturing method of claim 1.

15. A display device, comprising the display substrate of claim 14.

16. The display substrate of claim 14, wherein after the mother substrate is cut, each of the connection lines is cut into a plurality of independent sub-connection lines, different peripheral wirings are electrically connected with different sub-connection lines.

17. The display substrate of claim 14, wherein the peripheral wirings comprise a plurality of first peripheral wirings and a plurality of second peripheral wirings, and the step of forming the plurality of display substrate regions and the plurality of connection lines on the mother substrate comprises:
   forming the plurality of first peripheral wirings and the plurality of second peripheral wirings in each of the display substrate regions,
   wherein the plurality of first peripheral wirings and the plurality of second peripheral wirings are electrically connected with each other through at least one of the plurality of connection lines, the plurality of first peripheral wirings are electrically connected with common electrode lines of each of the display substrate regions, and the plurality of second peripheral wirings are corresponding with and electrically connected with gate lines of each of the display substrate regions, respectively.

* * * * *